United States Patent
Tam et al.

(10) Patent No.: US 7,019,565 B2
(45) Date of Patent: Mar. 28, 2006

(54) METHODS AND SYSTEMS FOR FULLY DIFFERENTIAL FREQUENCY DOUBLING

(75) Inventors: Derek Hing Sang Tam, Irvine, CA (US); Venugopal Gopinathan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 9 days.

(21) Appl. No.: 10/816,903

(22) Filed: Apr. 5, 2004

(65) Prior Publication Data

US 2005/0093588 A1    May 5, 2005

Related U.S. Application Data

(60) Provisional application No. 60/516,752, filed on Nov. 4, 2003.

(51) Int. Cl.
*H03B 19/00* (2006.01)
(52) U.S. Cl. ........................ 327/122; 327/116
(58) Field of Classification Search ............... 327/116, 327/119–120, 122; 377/47, 48
See application file for complete search history.

(56) References Cited

U.S. PATENT DOCUMENTS

| | | | | |
|---|---|---|---|---|
| 4,813,048 A | * | 3/1989 | Yamane et al. | 372/38.07 |
| 5,945,878 A | * | 8/1999 | Westwick et al. | 330/301 |
| 5,990,741 A | * | 11/1999 | Yamamoto et al. | 330/253 |
| 6,597,592 B1 | * | 7/2003 | Carsten | 363/127 |
| 6,664,824 B1 | * | 12/2003 | Laws | 327/122 |
| 6,696,888 B1 | * | 2/2004 | Gilbert | 327/560 |
| 6,882,191 B1 | * | 4/2005 | Kwok | 327/122 |

* cited by examiner

*Primary Examiner*—Timothy P. Callahan
*Assistant Examiner*—Cassandra Cox
(74) *Attorney, Agent, or Firm*—Sterne, Kessler, Goldstein & Fox, P.L.L.C.

(57) ABSTRACT

Methods and systems for fully differential frequency doubling include receiving a differential input signal having a first frequency, generating a non-inverted or positive output signal having twice the frequency of the input signal, and generating an inverted or negative version of the positive output signal. The positive and negative output signals form a fully differential output. The duty ratio of the output signals substantially matches a duty ratio of the input signals. Fully differential frequency doubling can be implemented with NMOS and/or PMOS devices. The invention further provides optional circuitry for increasing an output signal level.

12 Claims, 7 Drawing Sheets

METHODS AND SYSTEMS FOR FULLY DIFFERENTIAL FREQUENCY DOUBLING

BACKGROUND OF THE INVENTION

1. Field of the Invention

The present invention is directed to frequency doubling and, more particularly, to fully differential frequency doubling.

2. Related Art

Conventional frequency doublers suffer from relatively poor power supply rejection ratios ("PSRR"). Conventional frequency doublers also typically output non-50% duty ratios.

What are needed are improved methods and systems for frequency doubling.

SUMMARY OF THE INVENTION

The present invention is directed to fully differential (i.e., double-ended output) frequency doubling. Fully differential circuits in accordance with the invention provide, among other features, improved PSRR, as compared to non-differential circuits, and improved duty ratios.

The invention includes receiving a differential input signal having a first frequency, generating a non-inverted or positive output signal having twice the frequency of the input signal, and generating an inverted or negative version of the positive output signal. The positive and negative output signals form a fully differential output.

The duty ratio of the output signals substantially matches a duty ratio of the input signals. For example, when the input differential signal has a 50% duty ratio, the output differential signal will have a 50% duty ratio. The duty ratio is defined herein as the 'on' time over the 'period.' Thus, a sine wave should have a 50% duty ratio.

Optional processes include DC biasing the differential current signal. The invention is implemented with NMOS and/or PMOS devices. The invention further provides optional circuitry for increasing an output amplitude level.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing summary and the following detailed description are exemplary and explanatory and are intended to provide further explanation of the invention as claimed.

BRIEF DESCRIPTION OF THE DRAWINGS/FIGURES

The present invention will be described with reference to the accompanying drawings, wherein like reference numbers indicate identical or functionally similar elements. Also, the leftmost digit(s) of the reference numbers identify the drawings in which the associated elements are first introduced.

FIG. 1 is a high-level block diagram of a differential frequency doubler 100.

FIG. 2 is an example block diagram of the frequency doubler 100, including a differential frequency doubler module 202, a phase reversal module 204, and a DC bias module 206.

Figure 3:
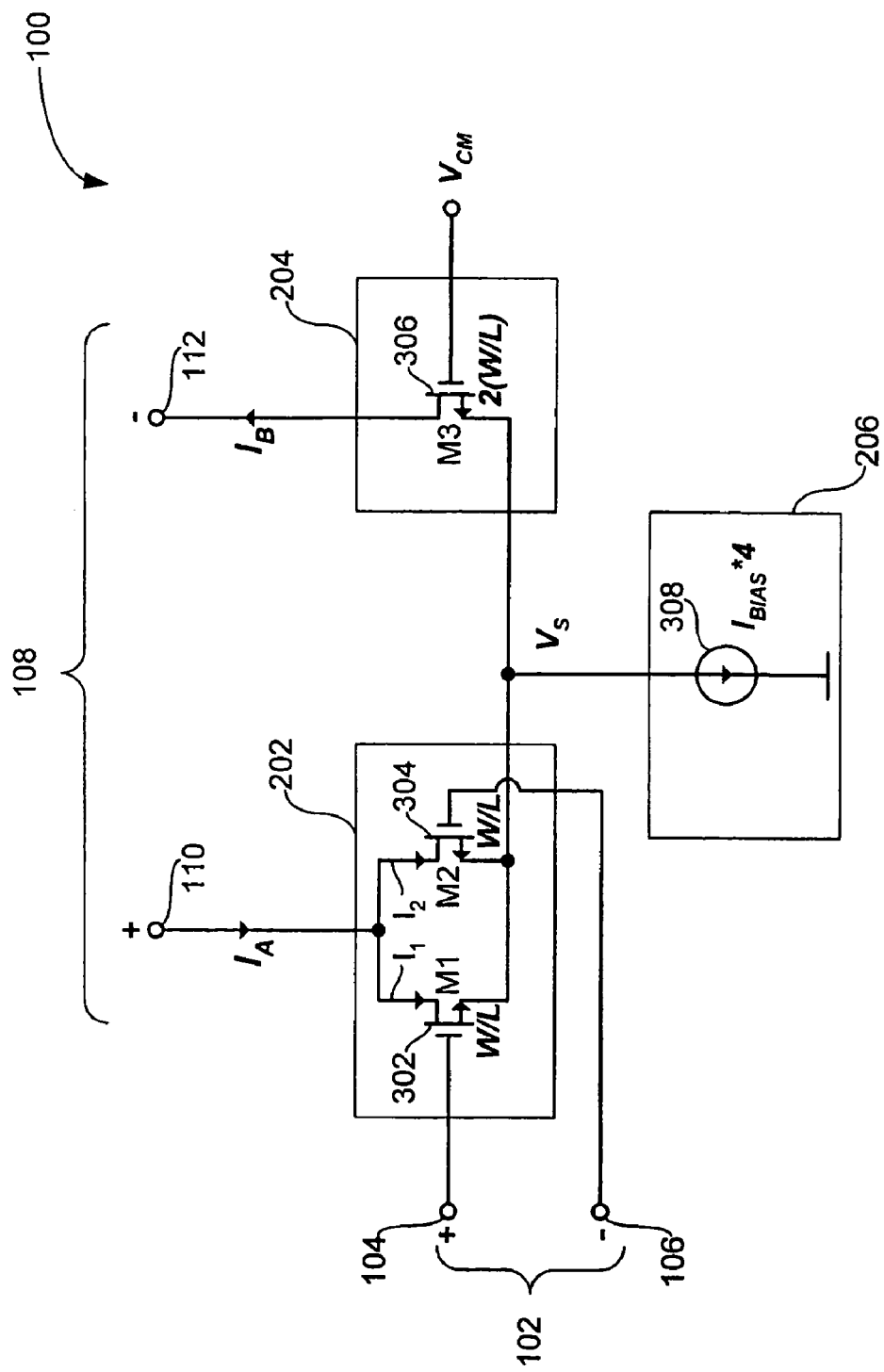
FIG. 3 is an example circuit diagram of the frequency doubler 100 implemented with NMOS devices.
Figure 5:
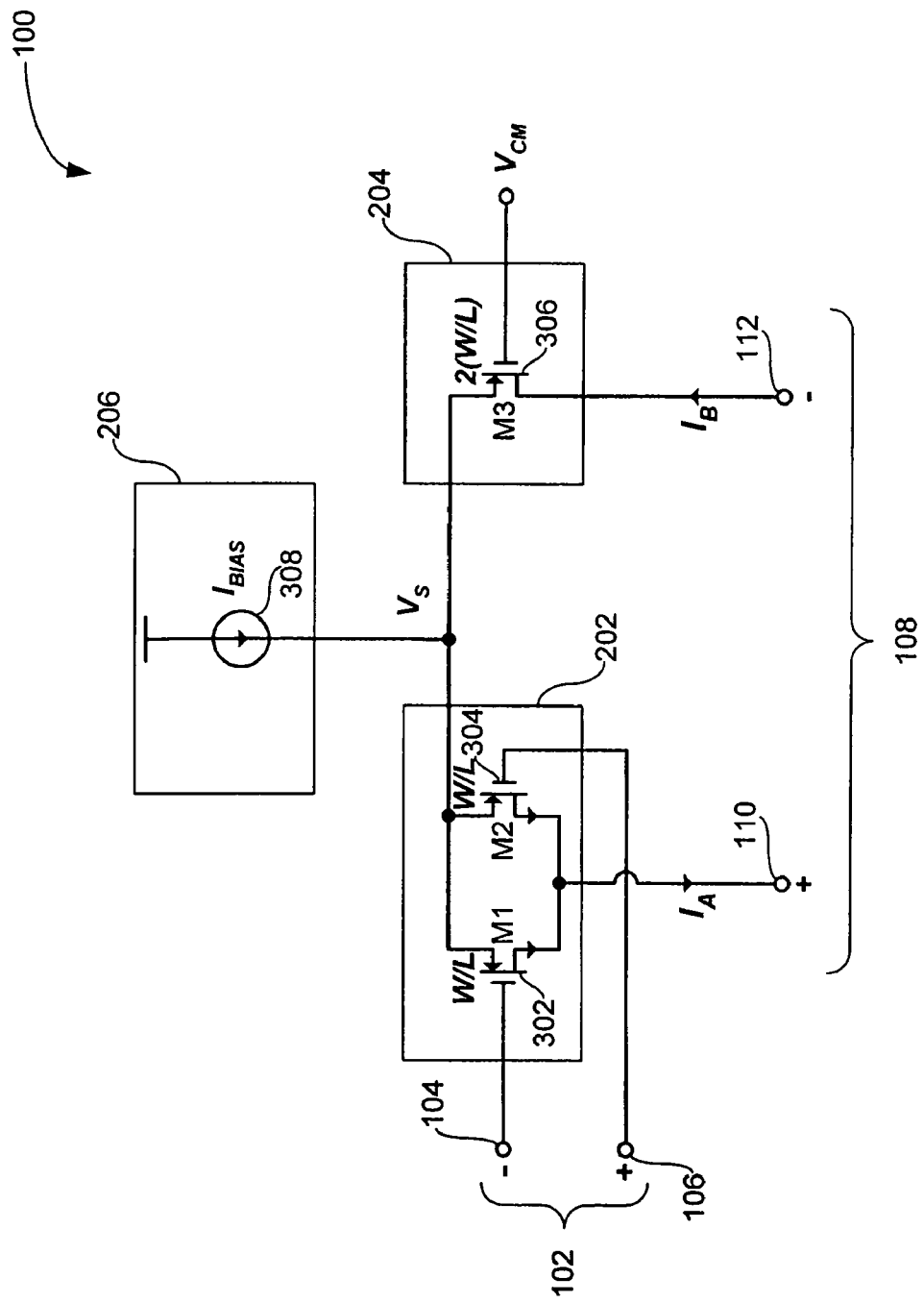
FIG. 5 is an example circuit diagram of the frequency doubler 100 implemented with PMOS devices.
Figure 6:
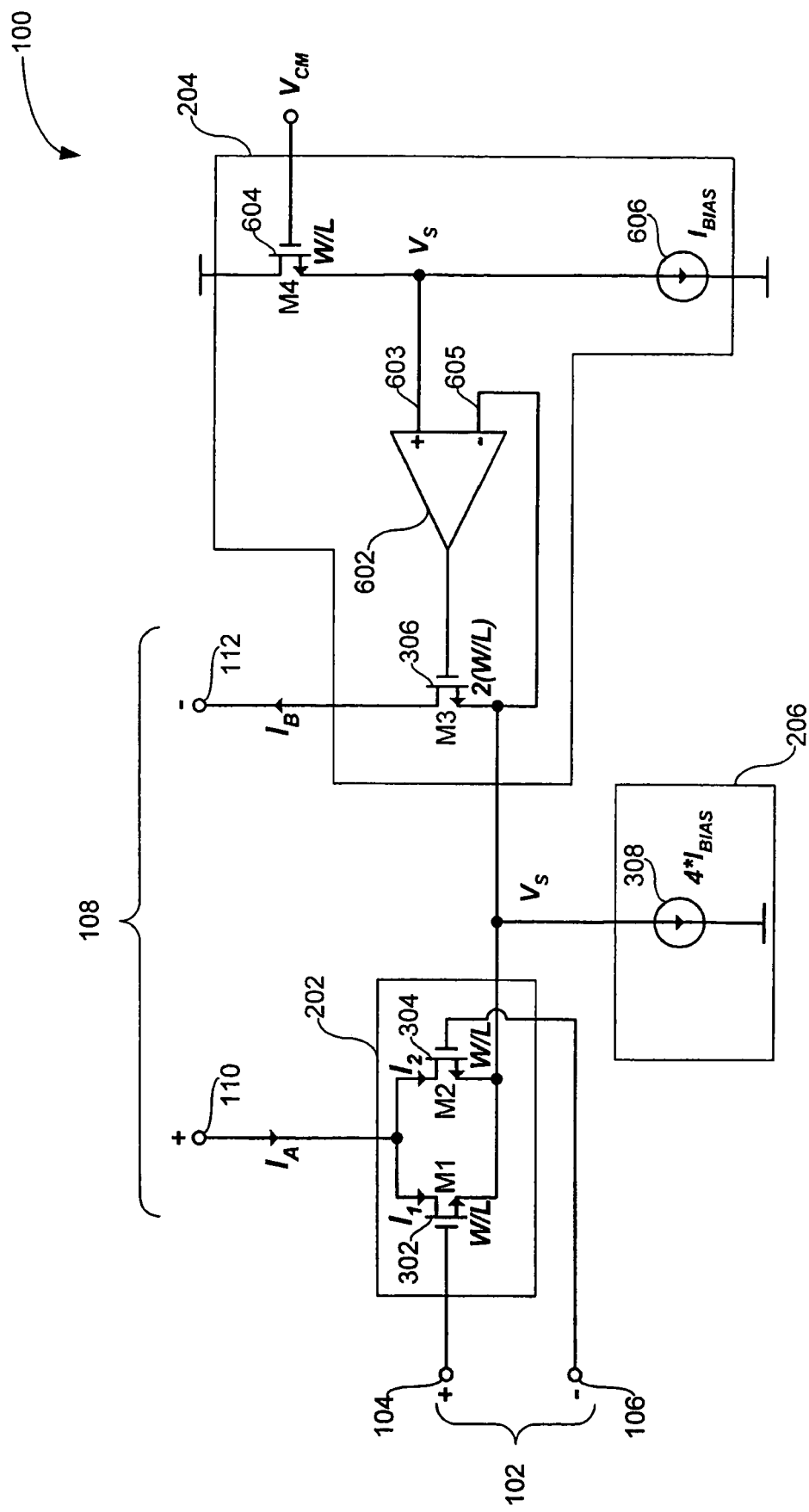

FIG. 6 is an example circuit diagram of the frequency doubler 100 implemented with NMOS devices, wherein the phase reversal module 204 includes additional circuitry that allows the frequency doubler 100 to provide a greater output current $I_{output}$ 108, for a given (W/L) ratio, as compared to the examples of FIG. 3 and FIG. 5.

Figure 7:
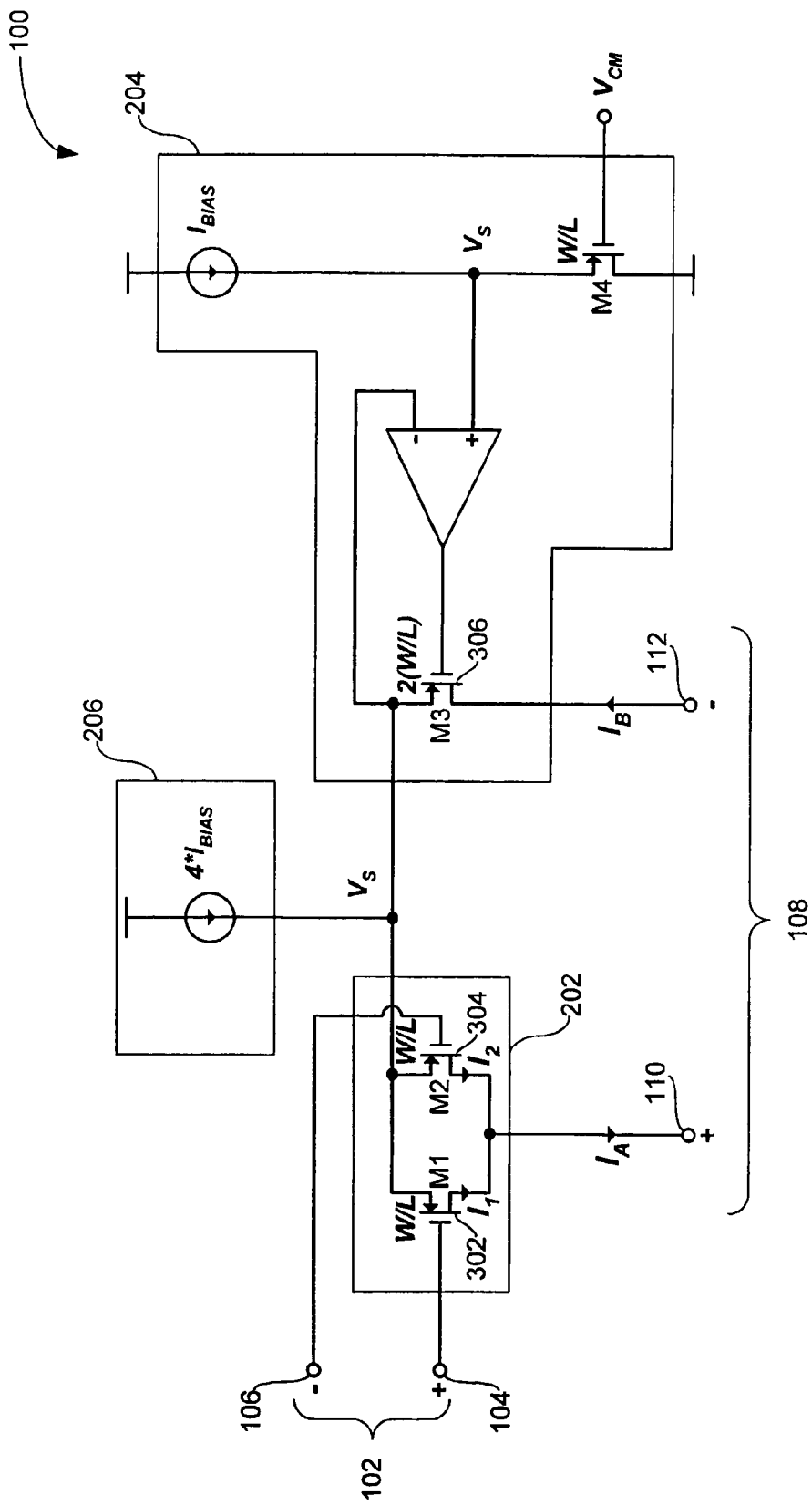

FIG. 7 is an example circuit diagram of the frequency doubler 100 implemented with PMOS devices, wherein the phase reversal module 204 includes additional circuitry that allows the frequency doubler 100 to provide a greater output current $I_{output}$ 108, for a given (W/L) ratio, as compared to the example of FIG. 5.

DETAILED DESCRIPTION OF THE INVENTION

The present invention is directed to improved methods and systems for frequency doubling. More particularly, the present invention is directed to improved methods and systems for fully differential (i.e., double-ended output) frequency doubling.

Figure 1:
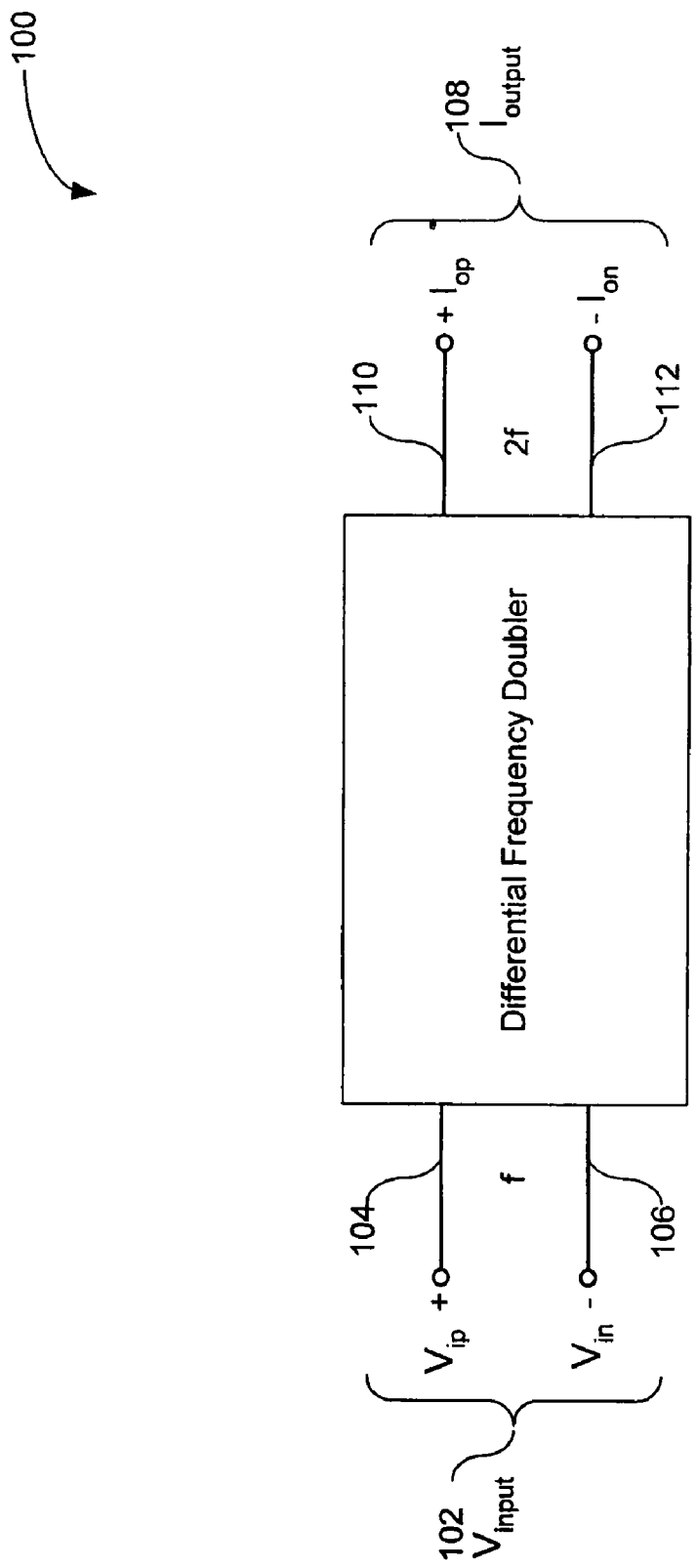

FIG. 1 is a high-level block diagram of a double-ended-output differential frequency doubler ("frequency doubler") 100 in accordance with the invention. The frequency doubler 100 receives a differential input signal $V_{input}$ 102, having a frequency f. $V_{input}$ 102 includes a positive non-inverted signal $V_{ip}$ 104 and a negative or inverted signal $V_{in}$ 106. The frequency doubler 100 outputs a fully differential output signal $I_{output}$ 108, having a frequency 2f. $I_{output}$ 108 includes a positive or non-inverted signal $I_{op}$ 110 and a negative or inverted signal $I_{on}$ 112.

In the example of FIG. 1, the output of frequency doubler 100 (i.e., $I_{output}$ 108) is illustrated as a current output. The current output can be converted into a voltage output of a desired amplitude range.

Figure 2:
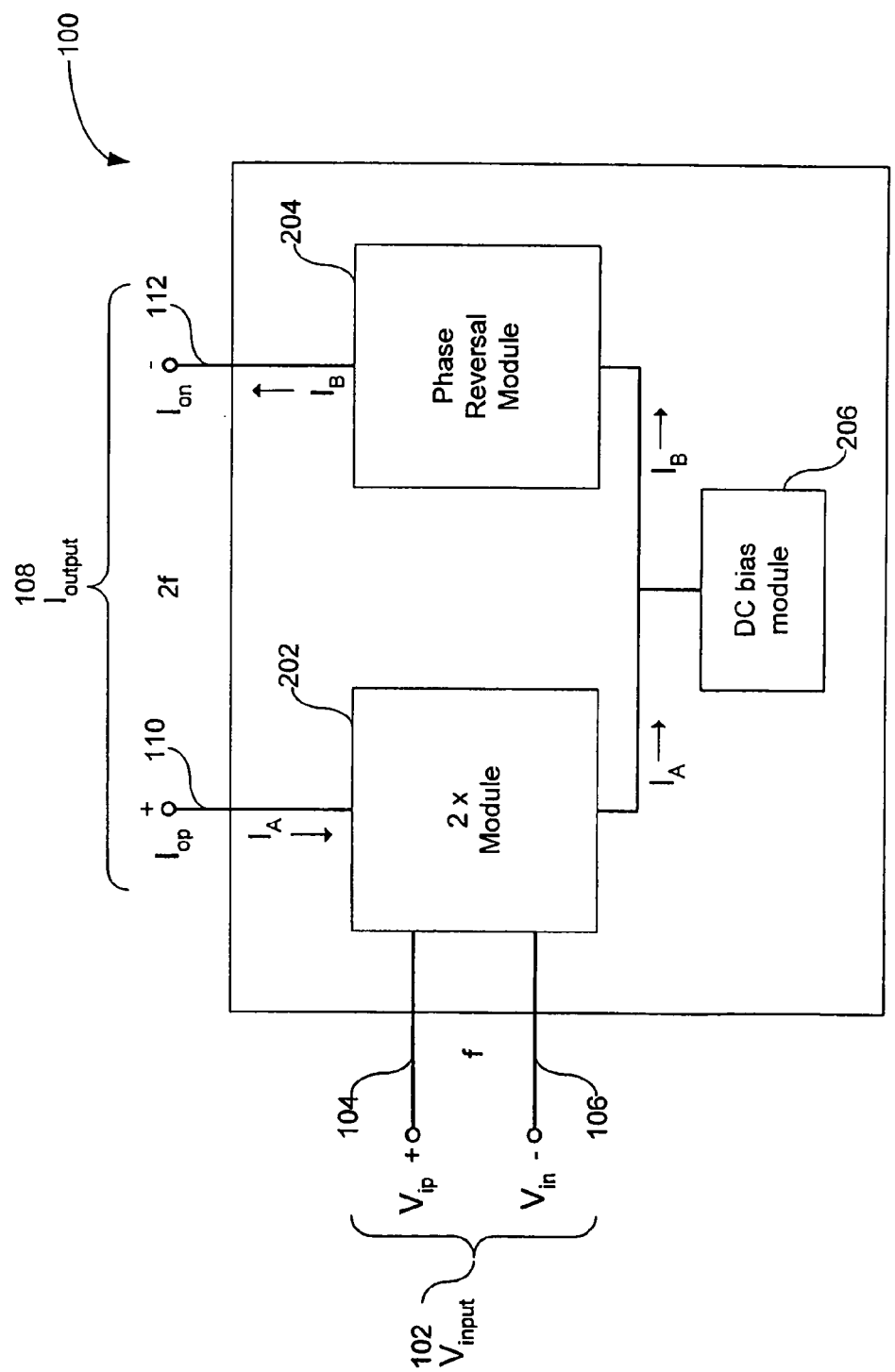

FIG. 2 is an example block diagram of the frequency doubler 100, wherein the frequency doubler 100 includes a differential frequency doubler module 202, a phase reversal module 204, and a DC bias module 206.

The differential frequency doubler module 202 receives $V_{input}$ 102 with frequency f and generates (AC) current signal $I_{op}$ 110, having frequency 2f. In FIG. 2, the current signal $I_{op}$ 110 is also illustrated as $I_A$.

The DC bias module 206 provides DC biasing to the current signal $I_{op}$ 110. The DC bias module 206 is a relatively high impedance module, or ideally infinite impedance, which substantially prevents the (AC) current signal $I_{op}$ 110 from passing through the DC bias module 206. The current signal $I_{op}$ 110 is thus forced to flow to phase reversal module 204.

The phase reversal module 204 generates a signal $I_{on}$ 112 that is substantially equal in amplitude to the signal $I_{op}$ 110, but opposite in phase. As a result, the duty ratio of the output signals $I_{op}$ 110 and $I_{on}$ 112 are substantially 50%, provided that the input signal is also 50% duty ratio. The duty ratio is defined herein as the 'on' time over the 'period.' Thus, a sine wave should have a 50% duty ratio. In FIG. 2, the current signal $I_{on}$ 112 is also illustrated as $I_B$.

The frequency doubler module 202, the phase reversal module 204, and the DC bias module 206 can be implemented in a variety of ways. Example embodiments of the differential frequency doubler module 202, the phase reversal module 204, and the DC bias module 206 are provided below. The invention is not, however, limited to the example embodiments provided herein. Based on the disclosure herein, one skilled in the relevant art(s) will understand that the differential frequency doubler module 202, the phase reversal module 204, and/or the DC bias module 206 can be implemented in other embodiments as well. Such other embodiments are within the spirit and scope of the present invention.

FIG. 3 is an example circuit diagram of the frequency doubler 100. In the example of FIG. 3, the frequency doubler module 202 includes transistors 302 and 304, also identified as M1 and M2, respectively. $V_{ip}$ 104 and $V_{in}$ 106 control gates of the transistors M1 and M2, respectively. The phase reversal module 204 includes a transistor 306, also illustrated as M3, having a gate controlled by a common mode voltage $V_{CM}$=(Vip+Vin)/2. The DC bias module 206 is illustrated as a DC current source 308. Operation of the differential frequency doubler 100 of FIG. 3 is described below in conjunction with FIG. 4.

Figure 4:
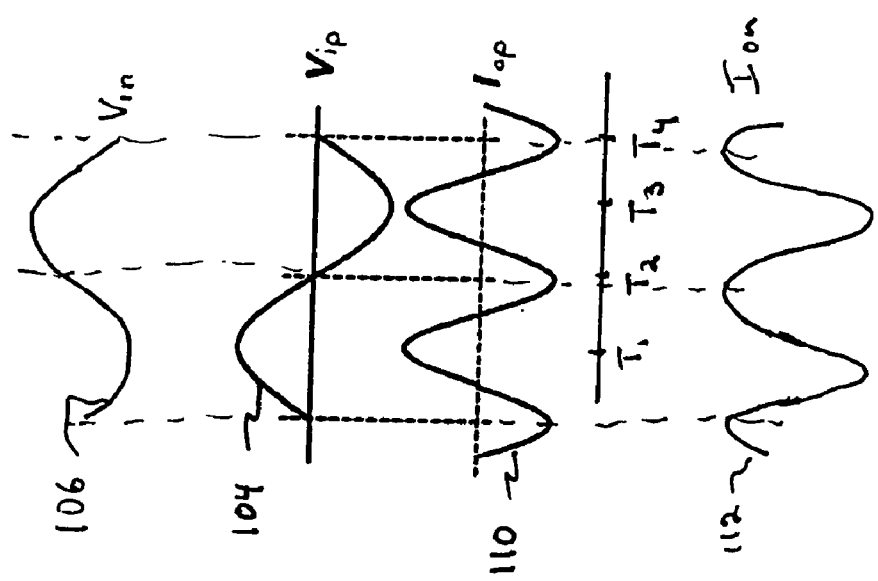
FIG. 4 is a timing diagram for the frequency doubler 100 illustrated in FIG. 3.

FIG. 4 is a timing diagram for the frequency doubler 100 illustrated in FIG. 3. Operation of the frequency doubler 100 illustrated in FIG. 3 is now described with reference to the timing diagram of FIG. 4.

In FIG. 3, the current $I_{op}$ 110 includes a current $I_1$ through M1, and a current $I_2$ through M2. Generally, as $V_{ip}$ 104 rises, M1 increasingly turns on, which increases the current $I_1$ through M1. At the same time, $V_{in}$ 106 falls, which increasingly turns off M2, which decreases the current $I_2$ through M2. Similarly, as $V_{ip}$ 104 falls and $V_{in}$ 106 rises, M1 increasingly turns off and M2 increasingly turns on, which respectively decreases the current $I_1$ through M1 and increases the current $I_2$ through M2.

Due to the square law nature of CMOS transistors, the current $I_1$ through M1, and $I_2$ through M2, are directly proportional to the square of their respective input gate voltages. The square behavior of the transistors will cause an exponential output current. The current through the transistors M1 and M2 is always positive, without regard to the polarity of their respective input gate voltages. In other words, the current through M1 is always flowing from the drain to the source, or in one direction only. The same applies to the current $I_2$ in M2. Combining $I_1$ and $I_2$ provides a frequency of 2 times the frequency of the input voltage, as described qualitatively below.

More specifically, and with reference to FIG. 4, at time $T_1$, $V_{ip}$ 104 is at a maximum and $V_{in}$ 106 is at a minimum. Therefore, currents $I_1$ and $I_2$ are at maximum and minimum respectively due to the squaring of $V_{ip}$ 104 and $V_{in}$ 106. Combing $I_1$ and $I_2$ should cause $I_{op}$ 110 at a maximum due to the exponential effect of the transistors.

At time $T_2$, $V_{ip}$ 104 and $V_{in}$ 106 approach a midway point between the maximum and minimum amplitudes, also referred to as the AC common-mode point. At this time, $I_1$ and $I_2$ are at minimum amplitudes and $I_{op}$ 110 falls to a minimum.

At time $T_3$, when $V_{ip}$ 104 is at a minimum and $V_{in}$ 106 is at a maximum, $I_{op}$ 110 is again at a maximum because of the squaring of $V_{ip}$ 104 and $V_{in}$ 106.

At time $T_4$, as $V_{in}$ 106 and $V_{ip}$ 104 approach the AC common-mode point, $I_{op}$ 110 falls to its minimum. Thus, $I_{op}$ 110 has a frequency that is double the frequency of $V_{ip}$ 104 and $V_{in}$ 106. Since $I_{op}$ 110 flow to M3 because of the high impedance (resistance) of the DC bias module 206, $I_{on}$ 112 is substantially equal to $I_{op}$ 110 in amplitude, but inverted with respect to $I_{op}$ 110.

As noted above, the currents $I_1$ and $I_2$ form the current $I_{op}$ 110. In order for transistor M3 to carry the combined currents $I_1$ and $I_2$, M3 is fabricated with a width/length ratio (W/L) that is approximately twice that of the transistors M1 and M2. Since the gate voltage of M3 is biased by a fixed voltage, $V_{CM}$, $I_{on}$ 112 is generated by varying $V_s$, the source voltage of M3.

Advantages of the frequency doubler 100 of FIG. 3 include fully differential outputs and thus improved power supply rejection ratios ("PSRR"), as compared to conventional frequency doublers.

The quantitative relationship between $V_{input}$ 102 and $I_{output}$ 108 for the example of FIG. 3 can be derived using current equations and is determined as follows:

$$I_1 = K^*(V_1 - V_X)^2; \text{ where } V_X = V_S + V_{TH};$$

$$I_2 = K^*(V_2 - V_X)^2;$$

$$I_B = 2K^*(V_{CM} - V_X)^2 = 2K^*[(V_1 + V_2)/2 - V_X]^2$$
$$= 2K^*[(V_1^2 + 2V_1V_2 + V_2^2)/4 - V_1V_X - V_2V_X + V_X^2]$$
$$= K^*[(V_1^2 + 2V_1V_2 + V_2^2)/2 - 2V_1V_X - 2V_2V_X + 2V_X^2]$$

$$I_A = I_1 + I_2 = K^*(V_1 - V_X)^2 + K^*(V_2 - V_X)^2$$
$$= K^*(V_1^2 - 2V_1V_X + V_X^2 + V_2^2 - 2V_2V_X + V_X^2)$$
$$= K^*(V_1^2 + V_2^2 - 2V_1V_X - 2V_2V_X + 2V_X^2)$$

$$I_{OUT} = I_A - I_B$$
$$= K^*(V_1^2/2 + V_2^2/2 - V_1V_2)$$
$$= K/2^*(V_1 - V_2)^2$$

$$I_{OUT} = K^*1/2^*V_{IN}^2$$

Where $V_s$ is the source voltage of transistors, and $V_{TH}$ is the threshold voltage. K is a device parameter and is proportional to W/L. Note $I_B=2^*K$ because the W/L ratio of M3 is 2 times of M1 (and M2). Equation for $I_1$ (or $I_2$) is a fundamental equation of MOS transistors.

Thus, $I_{output}=KV_{in}^2/2$       Eqs. (1)

The derivation above assumes that the transistors M1, M2, and M3 generally operate in saturation.

Let $V_{IN}$=sin(f)

$$I_{OUT}=K^*\tfrac{1}{2}^*\sin^2(f)=K^*\tfrac{1}{2}^*(\tfrac{1}{2}^*(1-\cos(2f)))$$

The output current $I_{OUT}$ will have a DC component and an AC component with a frequency of 2f. The DC component can be removed through a high-pass filter.

In the example of FIG. 3, the frequency doubler 100 is implemented with NMOS transistors. Alternatively, and/or additionally, the frequency doubler 100 is implemented with PMOS transistors, as illustrated in FIG. 5. Operation of the PMOS frequency doubler 100 illustrated in FIG. 5 is substantially similar to the NMOS frequency doubler 100 illustrated in FIG. 3, with the exception that the PMOS transistors M1, M2, and M3 in FIG. 5 turn on as the voltage at their respective gate terminals decrease.

In the example above, $I_{on}$ 112 is generated by M3 by fixing its gate voltage and varying its source voltage. Alternatively, $I_{on}$ 112 is generated by M3 by fixing its source voltage and varying its gate voltage. For example, FIG. 6 is an example circuit diagram of the frequency doubler 100 implemented with NMOS devices, wherein the phase reversal module 204 includes an operational or differential amplifier 602 and a fourth transistor 604, also identified as M4. Operation of these devices is described below. Generation of $I_{on}$ by either of the methods described herein is useful on its own, as well as in a frequency doubler.

As with the example of FIG. 3, the frequency doubler 100 illustrated in FIG. 6 provides fully differential current output $I_{output}$ 108. The frequency doubler 100 illustrated in FIG. 6 also provides improved PSRR as compared to conventional frequency doublers.

In the examples of FIG. 3 and FIG. 6, the bias module 206 includes a DC bias current 308, approximately equal to 4 times of I.sub.BIAS, which is the bias current for M4. In the example of FIG. 6, the phase reversal module 204 includes a DC bias current 606, also illustrated as I.sub.BIAS (i.e., ¼ of the DC bias current 308). Also in FIG. 6, M4 has a W/L ratio substantially similar to the W/L ratios of M1 and M2.

The purpose of the operational amplifier 602 in a feedback loop is to copy the voltage at the positive input terminal 603 to that of the negative input terminal 605. The source voltage, $V_s$, of M4 is thus copied to that of M1, M2, and M3. Since current source 308 is 4 times of current in current source 606, and the combined W/L ratio of M1, M2 and M3 is 4 times of M4, the current density of each branch, $I_1$, $I_2$ and $I_3$ ($I_B$) is equal to that of $I_4$ (M4 current). Since M4 is biased by $V_{CM}$ ((Vip+Vin)/2) while M1 and M2 is also centered at $V_{CM}$, the gate voltage of M3 is centered (dc biased) to $V_{CM}$ due to the same current density of M4.

Note that $V_s$ of M4 is a an AC ground node. Because of the feedback configuration of the operational amplifier 602, $V_s$, of M3 is an AC ground node. An AC ground node is defined as a node in which the node voltage is unchanged, or cannot be affected by AC voltage. Since $I_A$ needs to travel to M3 and the source voltage of M3 is ac-grounded, the gate voltage of M3 has to vary in order to generate $I_B$. In FIG. 3, note that the gate voltage of M3 is biased by $V_{CM}$. Since $V_{CM}$ is a fixed voltage, the source voltage node of M3 needs to vary instead.

Ideally, the DC bias current source 308 has an infinite output impedance (resistance). However, in practical realization, the output impedance is finite. If the output impedance of the DC bias current source 308 is comparable to the input impedance of M3 (impedance looking into the source), signal current $I_A$ will not fully flow into M3 and instead, will partially flow into the DC bias current source 308 and create undesired phase shift and signal lost in amplitude. This is improved by the design in FIG. 6, as described below.

Since M3 is biased inside a feedback loop with the operational amplifier 602, the feedback loop reduces the input source impedance of M3. Therefore, the signal current $I_A$ can flow into M3 even though the output impedance of the DC bias current source 308 is unchanged.

A quantitative analysis of the circuit illustrated in FIG. 6 is generally not feasible, or extremely difficult, if the gate voltage of M3 is involved.

Instead of finding the gate voltage of M3, $I_{BIAS}$ is used as the key of the circuit analysis. The total dc bias current 308 is equal to the sum of both $I_A$ and $I_B$. The current going through M4 is equal to $I_{BIAS}$. Therefore, substituting $I_{BIAS}$ into the total current of $I_A$ and $I_B$ can relate the gate voltage of M3 with $V_{CM}$.

The derivation below shows that for the W/L ratio of M4 and the bias current 606 that is ¼ the bias current 608, the amplitude of the output current $I_{output}$ 108 is doubled. The relationship between $V_{input}$ 102 and $I_{output}$ 108 for the example of FIG. 6 is derived as follows:

$$I_1 = K^*(V_1 - V_X)^2; \text{ where } V_X = V_S + V_{TH};$$

$$I_2 = K^*(V_2 - V_X)^2;$$

$$I_{BIAS} = K^*(V_{CM} - V_X)^2 = 2K^*[(V_1 + V_2)/2 - V_X]^2$$
$$= 2K^*[(V_1^2 + 2V_1V_2 + V_2^2)/4 - V_1V_X - V_2V_X + V_X^2]$$
$$= K^*[(V_1^2 + 2V_1V_2 + V_2^2)/2 - 2V_1V_X - 2V_2V_X + 2V_X^2]$$

$$I_A = I_1 + I_2 = K^*(V_1 - V_X)^2 + K^*(V_2 - V_X)^2$$
$$= K^*(V_1^2 - 2V_1V_X + V_X^2 + V_2^2 - 2V_2V_X + V_X^2)$$
$$= K^*(V_1^2 + V_2^2 - 2V_1V_X - 2V_2V_X + 2V_X^2)$$

$$I_B = 4^*I_{BIAS} - I_A$$

$$I_{OUT} = I_A - I_B = 2I_A - 4^*I_{BIAS}$$
$$= 2K^*(V_1^2/2 + V_2^2/2 - V_1V_2)$$
$$= K^*(V_1 - V_2)^2$$

$$I_{OUT} = K^*V_{IN}^2$$

Thus, $I_{output} = KV_{in}^2$ Eqs. (2)

Where K is proportional to W/L. Recall from Eqs. (1) above that for the example of FIG. 3, $I_{output} = KV_{in}^2/2$. Thus, the frequency doubler 100 illustrated in FIG. 6 provides twice the current $I_{output}$ 108, for a given (W/L) ratio and input voltage.

In the example of FIG. 6 the frequency doubler 100 is implemented with NMOS transistors. Alternatively, and/or additionally, the frequency doubler 100 of FIG. 6 is implemented with PMOS transistors, as illustrated in FIG. 7. Operation of the PMOS frequency doubler 100 illustrated in FIG. 7 is substantially similar to the operation of the NMOS frequency doublers 100 illustrated in FIG. 6, with the exception that the PMOS transistors M1, M2, M3, and M4 in FIG. 7 turn on as the voltages at their respective gate terminals decrease.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A differential frequency doubler circuit, comprising: differential input terminals;
differential output terminals;
a frequency doubler module coupled between said differential input terminals and a first one of said differential output terminals; and a phase reversal module coupled between said frequency doubler module and a second one of said differential output terminals;

wherein said frequency doubler module includes first and second transistors with approximately equivalent width/length ratios; and wherein said phase reversal module includes a third transistor with a width/length ratio approximately double said width/length ratios of said first and second transistors.

2. The apparatus according to claim 1, wherein said frequency doubler module receives a differential input signal and generates a first output signal having a frequency that is double a frequency of the differential input signal, and wherein said phase reversal module generates a second output signal that is substantially equal in amplitude and opposite in phase to the first output signal, wherein said first and second output signals form a differential output signal having the frequency that is double a frequency of the differential input signal.

3. The apparatus according to claim 2, wherein said differential output signal has a duty ratio that is substantially equal to a duty ratio of the input signal.

4. The apparatus according to claim 1, wherein said third transistor comprises a gate terminal coupled to a fixed voltage and a source terminal having a source terminal voltage that varies with an output of said frequency doubler.

5. A differential frequency doubler circuit, comprising:
differential input terminals;
differential output terminals;
a frequency doubler module coupled between said differential input terminals and a first one of said differential output terminals; and
a phase reversal module coupled between said frequency doubler module and a second one of said differential output terminals;
wherein said phase reversal module comprises a transistor including a source terminal coupled to a fixed voltage and a gate terminal having a gate terminal voltage that varies with an output of said frequency doubler.

6. The apparatus according to claim 1, further comprising:
a DC bias module coupled between said frequency doubler module and said phase reversal module.

7. The apparatus according to claim 1, wherein
said first transistor comprises a first NMOS transistor including a gate terminal coupled to a first one of said differential input terminals, a drain terminal coupled to said first one of said differential output terminals, and a source terminal; and
said second transistor comprises a second NMOS transistor including a gate terminal coupled to a second one of said differential input terminals, a drain terminal coupled to said first one of said differential output terminals, and a source terminal coupled to said first NMOS transistor source terminal; and
said third transistor comprises a third NMOS transistor including a drain terminal coupled to a second one of said differential output terminals, and a source terminal coupled to said source terminals of said first and second NMOS transistors, and a gate terminal coupled to said fixed voltage.

8. The apparatus according to claim 5, wherein said frequency doubler module comprises:
a first NMOS transistor including a gate terminal coupled to a first one of said differential input terminals, a drain terminal coupled to said first one of said differential output terminals, and a source terminal; and
a second NMOS transistor including a gate terminal coupled to a second one of said differential input terminals, a drain terminal coupled to said first one of said differential output terminals, and a source terminal coupled to said first NMOS source terminal;
wherein said phase reversal module transistor comprises:
a third NMOS transistor including a drain terminal coupled to a second one of said differential output terminals, a source terminal coupled to said source terminals of said first and second NMOS transistors, and a gate terminal;
a differential amplifier including an output coupled to said gate terminal of said third NMOS transistor, said differential amplifier including a negative input coupled to said source terminals of said first, second, and third NMOS transistors; and
a fourth NMOS transistor including a gate terminal coupled to said fixed voltage, and a source terminal coupled to a positive input of said differential amplifier.

9. The apparatus according to claim 8, wherein a width/length ratio of said third NMOS transistor is approximately double a width/length ratio of said first and second NMOS transistors.

10. The apparatus according to claim 8, wherein a width/length ratio of said fourth NMOS transistor is approximately equal to a width/length ratio of said first and second NMOS transistors.

11. A method of differentially doubling a frequency, comprising:
(1) receiving a differential signal having a first frequency;
(2) generating a first output signal from the received differential signal, the first output signal having a frequency that is double the first frequency;
(3) controlling a transistor to receive the first output signal and generate a second output signal that is opposite in phase to the first output signal, including:
coupling a source terminal of the transistor to a fixed voltage;
varying a gate terminal of the transistor with the first output signal;
whereby the transistor generates the second output signal substantially equal in amplitude and opposite in phase to the first output signal, wherein said first and second output signals form a differential output signal having a duty ratio that is substantially equal to a duty ratio of the received differential signal.

12. The method according to claim 1, wherein the varying of the gate terminal comprises varying a gate terminal of the transistor under control of an operational amplifier in a feedback loop.

* * * * *

UNITED STATES PATENT AND TRADEMARK OFFICE
CERTIFICATE OF CORRECTION

| | | |
|---|---|---|
| PATENT NO. | : 7,019,565 B2 | Page 1 of 1 |
| APPLICATION NO. | : 10/816903 | |
| DATED | : March 28, 2006 | |
| INVENTOR(S) | : Derek Hing Sang Tam | |

It is certified that error appears in the above-identified patent and that said Letters Patent is hereby corrected as shown below:

In claim 12, "claim 1" should be replaced by --claim 11--.

Signed and Sealed this

Eighteenth Day of July, 2006

JON W. DUDAS
*Director of the United States Patent and Trademark Office*